United States Patent
Pyun et al.

(10) Patent No.: US 12,046,169 B2
(45) Date of Patent: Jul. 23, 2024

(54) DISPLAY DEVICE

(71) Applicant: Samsung Display Co., Ltd., Yongin-si (KR)

(72) Inventors: Kihyun Pyun, Gwangmyeong-si (KR); Sung-Mo Yang, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/114,241

(22) Filed: Feb. 25, 2023

(65) Prior Publication Data
US 2023/0326381 A1    Oct. 12, 2023

(30) Foreign Application Priority Data
Apr. 12, 2022  (KR) .................. 10-2022-0045041

(51) Int. Cl.
*G09G 3/00*      (2006.01)
*G09G 3/3233*    (2016.01)
*H10K 59/131*    (2023.01)

(52) U.S. Cl.
CPC ........... *G09G 3/006* (2013.01); *G09G 3/3233* (2013.01); *G09G 2300/0842* (2013.01);
(Continued)

(58) Field of Classification Search
CPC ............ G09G 3/006; G09G 3/3233; G09G 2300/0842; G09G 2330/021; G09G 2330/025; G09G 2330/045; G09G 2330/08; G09G 2330/12; G09G 3/32; G09G 2330/028; G09G 3/2092; G09G 3/3225; G09G 2330/027; H10K 59/131;
(Continued)

(56) References Cited

U.S. PATENT DOCUMENTS

| | | | |
|---|---|---|---|
| 2014/0204104 A1* | 7/2014 | Jang | G09G 3/20 345/94 |
| 2015/0145423 A1* | 5/2015 | Lee | G09G 3/3225 315/161 |
| 2018/0059470 A1* | 3/2018 | Nam | G02F 1/1368 |

FOREIGN PATENT DOCUMENTS

| KR | 101286522 B1 | 7/2013 |
|---|---|---|
| KR | 1020180005866 A | 1/2018 |

(Continued)

*Primary Examiner* — Patrick N Edouard
*Assistant Examiner* — Joseph P Fox
(74) *Attorney, Agent, or Firm* — CANTOR COLBURN LLP

(57) ABSTRACT

A display device includes: a display panel including first and second wirings; a control circuit board spaced apart from the display panel and including a power management circuit which provides a driving voltage to the first and second wirings; a first cable coupled to the control circuit board and electrically connecting the power management circuit and the first wiring; a second cable coupled to the control circuit board and electrically connecting the power management circuit and the second wiring; an abnormal coupling detector connected between the first and second wirings and generating first and second protection signals based on a difference between a first voltage of the first wiring and a second voltage of the second wiring; and a voltage supply controller counting the first and second protection signals, and providing a shutdown signal to the power management circuit such that the power management circuit stops providing the driving voltage.

20 Claims, 10 Drawing Sheets

(52) U.S. Cl.
CPC . *G09G 2330/021* (2013.01); *G09G 2330/025* (2013.01); *G09G 2330/045* (2013.01); *G09G 2330/08* (2013.01); *G09G 2330/12* (2013.01); *H10K 59/131* (2023.02)

(58) Field of Classification Search
CPC .......... H01L 29/78645; H01L 29/7869; H01L 29/78696; G01R 19/165; G01R 31/2825; G01R 31/2836
See application file for complete search history.

(56) References Cited

FOREIGN PATENT DOCUMENTS

| | | | |
|---|---|---|---|
| KR | 102063815 | B1 | 1/2020 |
| KR | 102069223 | B1 | 1/2020 |

\* cited by examiner

DISPLAY DEVICE

This application claims priority to Korean Patent Application No. 10-2022-0045041 filed on Apr. 12, 2022, and all the benefits accruing therefrom under 35 U.S.C. § 119, the content of which in its entirety is herein incorporated by reference.

BACKGROUND

1. Field

Embodiments relate to a display device.

2. Description of the Related Art

A display device may include a display panel displaying an image, a circuit board generating voltages for driving the display panel, and a plurality of cables (e.g., a first cable and a second cable) connecting the display panel and the circuit board. The circuit board may provide the voltages to the display panel through the cables.

When the first cable is abnormally coupled to the circuit board, a contact resistance between the first cable and the circuit board may increase, and accordingly, a current flowing through the first cable may decrease. In this case, a current flowing through the second cable may increase, and the display panel may be burnt due to an overcurrent.

SUMMARY

Embodiments provide a display device in which a display panel is prevented from being burnt.

A display device according to embodiments includes: a display panel including a first wiring and a second wiring; a control circuit board spaced apart from the display panel and including a power management circuit which provides a driving voltage to the first wiring and the second wiring; a first cable having a first end coupled to the control circuit board, wherein the first cable electrically connects the power management circuit and the first wiring; a second cable having a first end coupled to the control circuit board, wherein the second cable electrically connects the power management circuit and the second wiring; an abnormal coupling detector connected between the first wiring and the second wiring, and which generates a first protection signal and a second protection signal based on a difference between a first voltage of the first wiring and a second voltage of the second wiring; and a voltage supply controller, which counts the first protection signal and the second protection signal, and provides a shutdown signal to the power management circuit such that the power management circuit stops providing the driving voltage.

In an embodiment, the abnormal coupling detector may include a first diode array including first diodes connected in series in a forward direction from the second wiring to the first wiring, and a second diode array including second diodes connected in series in a forward direction from the first wiring to the second wiring.

In an embodiment, the first diodes and the second diodes may be diode-connected transistors.

In an embodiment, the abnormal coupling detector may further include: a first protection signal generator, which generates the first protection signal in response to a voltage between the first diodes, and a second protection signal generator, which generates the second protection signal in response to a voltage between the second diodes.

In an embodiment, the first protection signal generator may include a first switch, which is on/off according to the voltage between the first diodes, and the second protection signal generator may include a second switch which is on/off according to the voltage between the second diodes.

In an embodiment, the display device may further include: a first source circuit board coupled to a second end of the first cable, a second source circuit board coupled to a second end of the second cable, and flexible circuit boards each connected between the display panel and the first source circuit board or between the display panel and the second source circuit board.

In an embodiment, when the first cable is normally coupled to the control circuit board and the first source circuit board, and the second cable is normally coupled to the control circuit board and the second source circuit board, a current path may not be formed between the first wiring and the second wiring through the first diode array and the second diode array.

In an embodiment, when the first cable is abnormally coupled to the control circuit board or the first source circuit board, a current path may be formed from the second wiring to the first wiring through the first diode array, and when the second cable is abnormally coupled to the control circuit board or the second source circuit board, a current path may be formed from the first wiring to the second wiring through the second diode array.

In an embodiment, the voltage supply controller may count the first protection signal and the second protection signal every frame to calculate a first count value and a second count value, respectively.

In an embodiment, the voltage supply controller may generate the shutdown signal when the first count value or the second count value is greater than a preset reference count value during a preset reset period.

A display device according to embodiments includes: a display panel including pixels, and a first wiring and a second wiring which provide a driving voltage to the pixels; a gate driver, which provides gate signals to the pixels; a data driver, which provides data voltages to the pixels; a power management circuit, which provides the driving voltage to the first wiring and the second wiring, provides a gate driving voltage to the gate driver, and provides a data driving voltage to the data driver; an abnormal coupling detector connected between the first wiring and the second wiring, and which generates a first protection signal and a second protection signal based on a difference between a first voltage of the first wiring and a second voltage of the second wiring; and a voltage supply controller, which counts the first protection signal and the second protection signal, and provides a shutdown signal to the power management circuit such that the power management circuit stops providing the driving voltage, the gate driving voltage, and the data driving voltage.

In an embodiment, the abnormal coupling detector may include a first diode array including first diodes connected in series in a forward direction from the second wiring to the first wiring, and a second diode array including second diodes connected in series in a forward direction from the first wiring to the second wiring.

In an embodiment, the first diodes and the second diodes may be diode-connected transistors.

In an embodiment, the abnormal coupling detector may further include: a first protection signal generator, which generates the first protection signal in response to a voltage between the first diodes, and a second protection signal generator, which generates the second protection signal in response to a voltage between the second diodes.

In an embodiment, the first protection signal generator may include a first switch which is on/off according to the voltage between the first diodes, and the second protection signal generator may include a second switch which is on/off according to the voltage between the second diodes.

In an embodiment, the display device may further include: a control circuit board spaced apart from the display panel, and including the power management circuit; a first cable having a first end coupled to the control circuit board, the first cable electrically connecting the power management circuit and the first wiring; a second cable having a first end coupled to the control circuit board, the second cable electrically connecting the power management circuit and the second wiring; a first source circuit board coupled to a second end of the first cable; a second source circuit board coupled to a second end of the second cable; and flexible circuit boards each connected between the display panel and the first source circuit board or between the display panel and the second source circuit board.

In an embodiment, when the first cable is normally coupled to the control circuit board and the first source circuit board and the second cable is normally coupled to the control circuit board and the second source circuit board, a current path may not be formed between the first wiring and the second wiring through the first diode array and the second diode array.

In an embodiment, when the first cable is abnormally coupled to the control circuit board or the first source circuit board, a current path may be formed from the second wiring to the first wiring through the first diode array, and when the second cable is abnormally coupled to the control circuit board or the second source circuit board, a current path may be formed from the first wiring to the second wiring through the second diode array.

In an embodiment, the voltage supply controller may count the first protection signal and the second protection signal every frame to calculate a first count value and a second count value, respectively.

In an embodiment, the voltage supply controller may generate the shutdown signal when the first count value or the second count value is greater than a preset reference count value during a preset reset period.

In the display device according to the embodiments, abnormal coupling of the first cable or the second cable may be detected based on a difference between the first voltage of the first wiring electrically connected to the first cable and the second voltage of the second wiring electrically connected to the second cable, and supply of the driving voltage may be stopped when the first cable or the second cable is abnormally coupled, so that the display panel may not be burnt due to the abnormal coupling of the first cable or the second cable.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
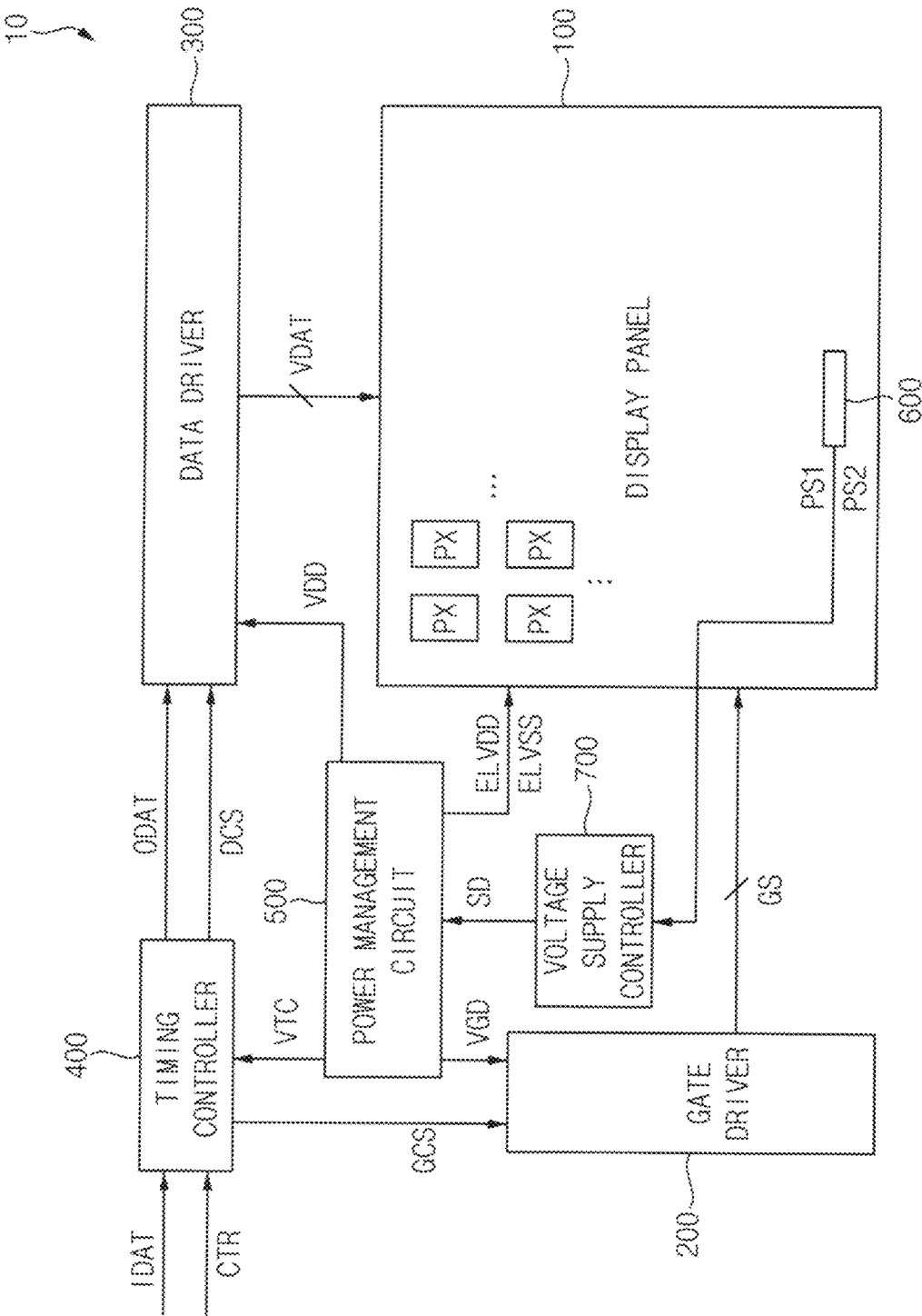
FIG. 1 is a block diagram illustrating a display device according to an embodiment.

It will be understood that when an element is referred to as being "connected to" another element, it can be directly connected to the other element or intervening elements may be present therebetween. In contrast, when an element is referred to as being "directly connected to" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Hereinafter, a display device according to embodiments of the present disclosure will be described in more detail with reference to the accompanying drawings. The same or similar reference numerals will be used for the same elements in the accompanying drawings.

FIG. 1 is a block diagram illustrating a display device 10 according to an embodiment.

Referring to FIG. 1, the display device 10 may include a display panel 100, a gate driver 200, a data driver 300, a timing controller 400, a power management circuit 500, an abnormal coupling detector 600, and a voltage supply controller 700.

The display panel 100 may include various display elements such as organic light emitting diode ("OLED") or the like. Hereinafter, the display panel 100 including the organic light emitting diode as the display element will be described for convenience. However, the present disclosure is not limited thereto, and the display panel 100 may include various display elements such as a liquid crystal display ("LCD") element, an electrophoretic display ("EPD") element, an inorganic light emitting diode, a quantum dot light emitting diode, or the like in another embodiment.

The display panel 100 may include a plurality of pixels PX. The pixels PX may receive gate signals GS, data voltages VDAT, and driving voltages ELVDD and ELVSS. The pixels PX may emit light based on the gate signals GS, the data voltages VDAT, and the driving voltages ELVDD and ELVSS.

The gate driver 200 (or a scan driver) may generate the gate signals GS (or scan signals) based on a gate control signal GCS and a gate driving voltage VGD, and may provide the gate signals GS to the pixels PX. The gate control signal GCS may include a gate start signal, a gate clock signal, or the like. The gate driver 200 may be implemented as a shift register, but is not limited thereto.

The data driver 300 (or a source driver) may generate the data voltages VDAT based on output image data ODAT, a data control signal DCS, and a data driving voltage VDD, and may provide the data voltages VDAT to the pixels PX. The data control signal DCS may include a data clock signal, a data enable signal, or the like.

The timing controller 400 may control an operation of the gate driver 200 and an operation of the data driver 300. The timing controller 400 may generate the output image data ODAT, the gate control signal GCS, and the data control signal DCS based on input image data IDAT, a control signal CTR, and a timing control voltage VTC. The timing controller 400 may provide the gate control signal GCS to the gate driver 200, and may provide the output image data ODAT and the data control signal DCS to the data driver 300. The control signal CTR may include a vertical synchronization signal, a horizontal synchronization signal, a clock signal, or the like.

The power management circuit 500 may provide the driving voltages ELVDD and ELVSS to the display panel 100, may provide the gate driving voltage VGD to the gate driver 200, may provide the data driving voltage VDD to the data driver 300, and may provide the timing control voltage VTC to the timing controller 400. The driving voltages ELVDD and ELVSS may include a first driving voltage ELVDD and a second driving voltage ELVSS. In an embodiment, the first driving voltage ELVDD may be higher than the second driving voltage ELVSS. For example, the first driving voltage ELVDD may be about 24 voltages (V), and the second driving voltage ELVSS may be about 0 V.

The abnormal coupling detector 600 may detect whether a first cable FFC1 in FIG. 4 or a second cable FFC2 in FIG. 4, which will be described below, is abnormally coupled, and may generate a first protection signal PS1 and a second protection signal PS2 according to abnormal coupling of the first cable FFC1 or the second cable FFC2.

Configuration and operation of the abnormal coupling detector 600 will be described below with reference to FIGS. 5 and 7 to 9.

The voltage supply controller 700 may count the first protection signal PS1 and the second protection signal PS2, and may provide a shutdown signal SD to the power management circuit 500 such that the voltage supply controller 700 stops providing the driving voltages ELVDD and ELVSS, the gate driving voltage VGD, and the data driving voltage VDD to the power management circuit 500 to the display panel 100, the gate driver 200, and the data driver 300, respectively.

An operation of the voltage supply controller 700 will be described below with reference to FIG. 6.

Figure 2:
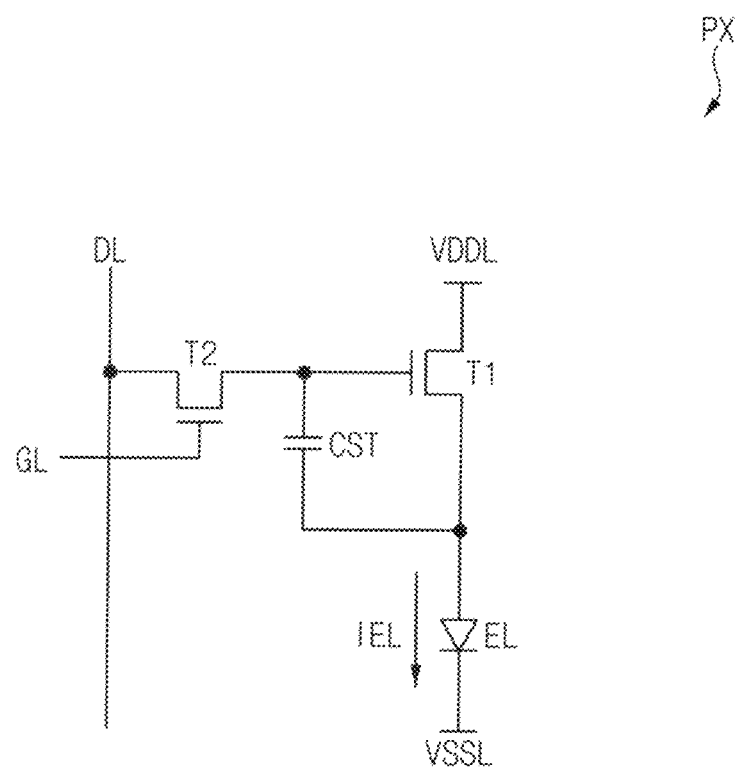
FIG. 2 is a circuit diagram illustrating a pixel included in the display device in FIG. 1.

FIG. 2 is a circuit diagram illustrating the pixel PX included in the display device 10 in FIG. 1.

Referring to FIGS. 1 and 2, the pixel PX may include a first transistor T1, a second transistor T2, a storage capacitor CST, and a light emitting element EL.

The first transistor T1 may provide a driving current IEL to the light emitting element EL. A first electrode of the first transistor T1 may be connected to a first power line VDDL that transmits the first driving voltage ELVDD, and a second electrode of the first transistor T1 may be connected to a first electrode of the light emitting element EL. A gate electrode of the first transistor T1 may be connected to a second electrode of the second transistor T2.

The second transistor T2 may provide the data voltage VDAT to the gate electrode of the first transistor T1 in response to the gate signal GS. A first electrode of the second transistor T2 may be connected to a data line DL that transmits the data voltage VDAT, and the second electrode of the second transistor T2 may be connected to the gate electrode of the first transistor T1. A gate electrode of the second transistor T2 may be connected to a gate line GL that transmits the gate signal GS.

FIG. 2 illustrates an embodiment in which each of the first transistor T1 and the second transistor T2 is an NMOS transistor, however, the present disclosure is not limited thereto. In another embodiment, at least one of the first transistor T1 and the second transistor T2 may be a PMOS transistor.

The storage capacitor CST may maintain a voltage of the gate electrode of the first transistor T1. A first electrode of the storage capacitor CST may be connected to the gate electrode of the first transistor T1, and a second electrode of the storage capacitor CST may be connected to the second electrode of the first transistor T1.

The light emitting element EL may emit light based on the driving current IEL The first electrode of the light emitting element EL may be connected to the second electrode of the first transistor T1, and a second electrode of the light emitting element EL may be connected to a second power line VSSL that transmits the second driving voltage ELVSS. The driving current IEL may flow through the light emitting element EL, and accordingly, the driving current IEL may flow from the first power line VDDL to the second power line VSSL.

Figure 3:
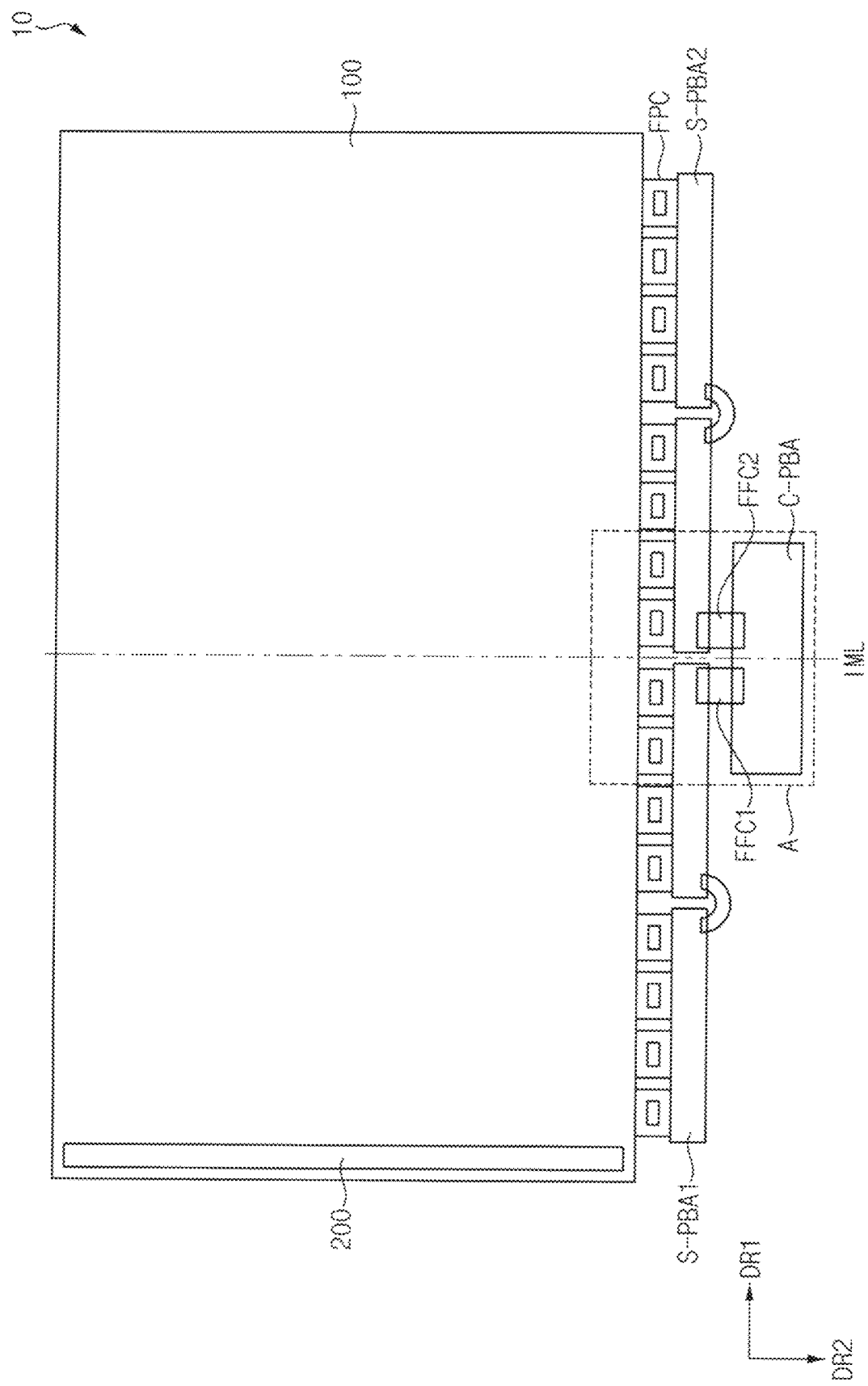
FIG. 3 is a plan view illustrating a display device according to an embodiment.

FIG. 3 is a plan view illustrating a display device 10 according to an embodiment. FIG. 4 is a plan view illustrating an area "A" in FIG. 3.

Referring to FIGS. 1, 2, 3, and 4, the display device 10 may include a display panel 100, a control circuit board C-PBA, a first source circuit board S-PBA1, a second source circuit board S-PBA2, a first cable FFC1, a second cable FFC2, and flexible circuit boards FPC.

The display panel 100 may include a first wiring WR1 and a second wiring WR2. In an embodiment, the second wiring WR2 may be disposed in a first direction DR1 from the first wiring WR1. For example, with respect to an imaginary line IML, extending in a second direction DR2 crossing the first direction DR1 from a center of the display panel 100, the first wiring WR1 may be disposed in a direction opposite to the first direction DR1 from the imaginary line IML, and the second wiring WR2 may be disposed in the first direction DR1 from the imaginary line IML.

The first wiring WR1 and the second wiring WR2 may be electrically connected to each other. The first wiring WR1 and the second wiring WR2 may provide the first driving voltage ELVDD or the second driving voltage ELVSS to the pixels PX. When the first wiring WR1 and the second wiring WR2 provide the first driving voltage ELVDD to the pixels PX, the first wiring WR1 and the second wiring WR2 may be connected to the first power line VDDL. When the first wiring WR1 and the second wiring WR2 provide the second driving voltage ELVSS to the pixels PX, the first wiring WR1 and the second wiring WR2 may be connected to the second power line VSSL.

The abnormal coupling detector 600 may be disposed on the display panel 100. The abnormal coupling detector 600 may be connected between the first wiring WR1 and the second wiring WR2. In an embodiment, the abnormal coupling detector 600 may be positioned on the imaginary line IML.

The gate driver 200 may be disposed on the display panel 100. FIG. 3 illustrates that the gate driver 200 is disposed on a side (e.g., left side) of the display panel 100 in the first direction DR1, but the present disclosure is not limited thereto. In another embodiment, the gate driver 200 may be disposed on opposite sides (e.g., right side) of the display panel 100 in the first direction DR1 in another embodiment.

The control circuit board C-PBA may be spaced apart from the display panel 100 in the second direction DR2. In an embodiment, the control circuit board C-PBA may include the timing controller 400, the power management circuit 500, and the voltage supply controller 700. The power management circuit 500 may provide the first driving voltage ELVDD or the second driving voltage ELVSS to the first wiring WR1 and the second wiring WR2. In an embodiment, the control circuit board C-PBA may be a printed board assembly ("PBA").

The first source circuit board S-PBA1 and the second source circuit board S-PBA2 may be disposed between the display panel 100 and the control circuit board C-PBA. The first source circuit board S-PBA1 may be disposed in a direction opposite to the first direction DR1 from the imaginary line IML, and the second source circuit board S-PBA2 may be disposed in the first direction DR1 from the imaginary line IML. In an embodiment, each of the first source circuit board S-PBA1 and the second source circuit board S-PBA2 may be the printed board assembly (PBA).

The first cable FFC1 may be disposed between the control circuit board C-PBA and the first source circuit board S-PBA1. A first end of the first cable FFC1 may be coupled to the control circuit board C-PBA, and a second end of the first cable FFC1 may be coupled to the first source circuit board S-PBA1. The first cable FFC1 may transmit the first driving voltage ELVDD and the second driving voltage ELVSS from the control circuit board C-PBA to the first source circuit board S-PBA1. The first cable FFC1 may electrically connect the power management circuit 500 and the first wiring WR1. In an embodiment, the first cable FFC1 may be a flexible flat cable ("FFC").

The second cable FFC2 may be disposed between the control circuit board C-PBA and the second source circuit board S-PBA2. A first end of the second cable FFC2 may be coupled to the control circuit board C-PBA, and a second end of the second cable FFC2 may be coupled to the second source circuit board S-PBA2. The second end may be opposite to the first end. The second cable FFC2 may transmit the first driving voltage ELVDD and the second driving voltage ELVSS from the control circuit board C-PBA to the second source circuit board S-PBA2. The second cable FFC2 may electrically connect the power management circuit 500 and the second wiring WR2. In an embodiment, the second cable FFC2 may be the flexible flat cable (FFC).

Each of the flexible circuit boards FPC may be connected between the display panel 100 and the first source circuit board S-PBA1 or between the display panel 100 and the second source circuit board S-PBA2. A first end of each of the flexible circuit boards FPC may be connected to the display panel 100, and a second end of each of the flexible circuit boards FPC may be connected to the first source circuit board S-PBA1 or the second source circuit board S-PBA2. The second end may be opposite to the first end.

The data driver 300 may be disposed on the flexible circuit boards FPC. The data driver 300 may be implemented in the form of an integrated circuit, and may be mounted on the flexible circuit boards FPC.

The first driving voltage ELVDD or the second driving voltage ELVSS may be transmitted to the first wiring WR1 from the control circuit board C-PBA including the power management circuit 500 through the first cable FFC1, the first source circuit board S-PBA1, and the flexible circuit boards FPC connected to the first source circuit board S-PBA1. The first driving voltage ELVDD or the second driving voltage ELVSS may be transmitted to the second wiring WR2 from the control circuit board C-PBA through the second cable FFC2, the second source circuit board S-PBA2, and the flexible circuit boards FPC connected to the second source circuit board S-PBA2.

Figure 4:
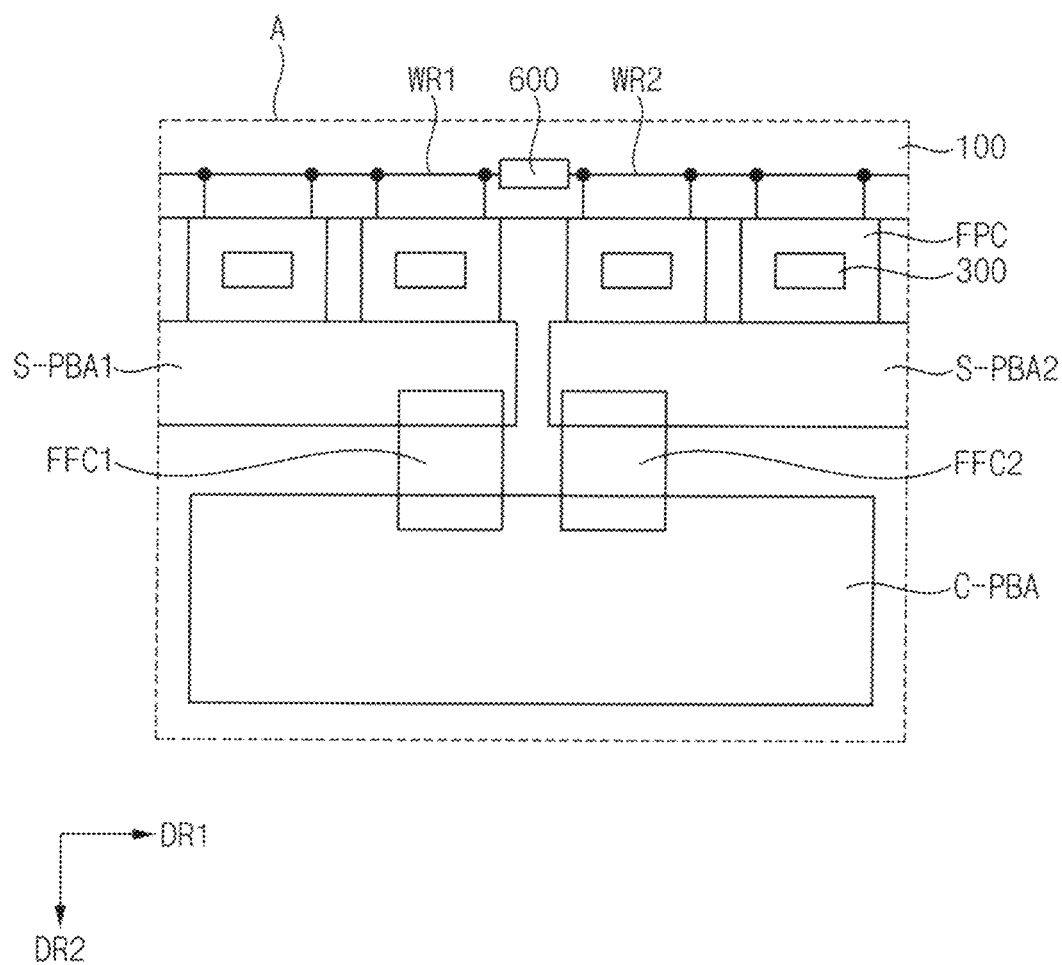
FIG. 4 is a plan view illustrating an area "A" in FIG. 3.
Figure 5:
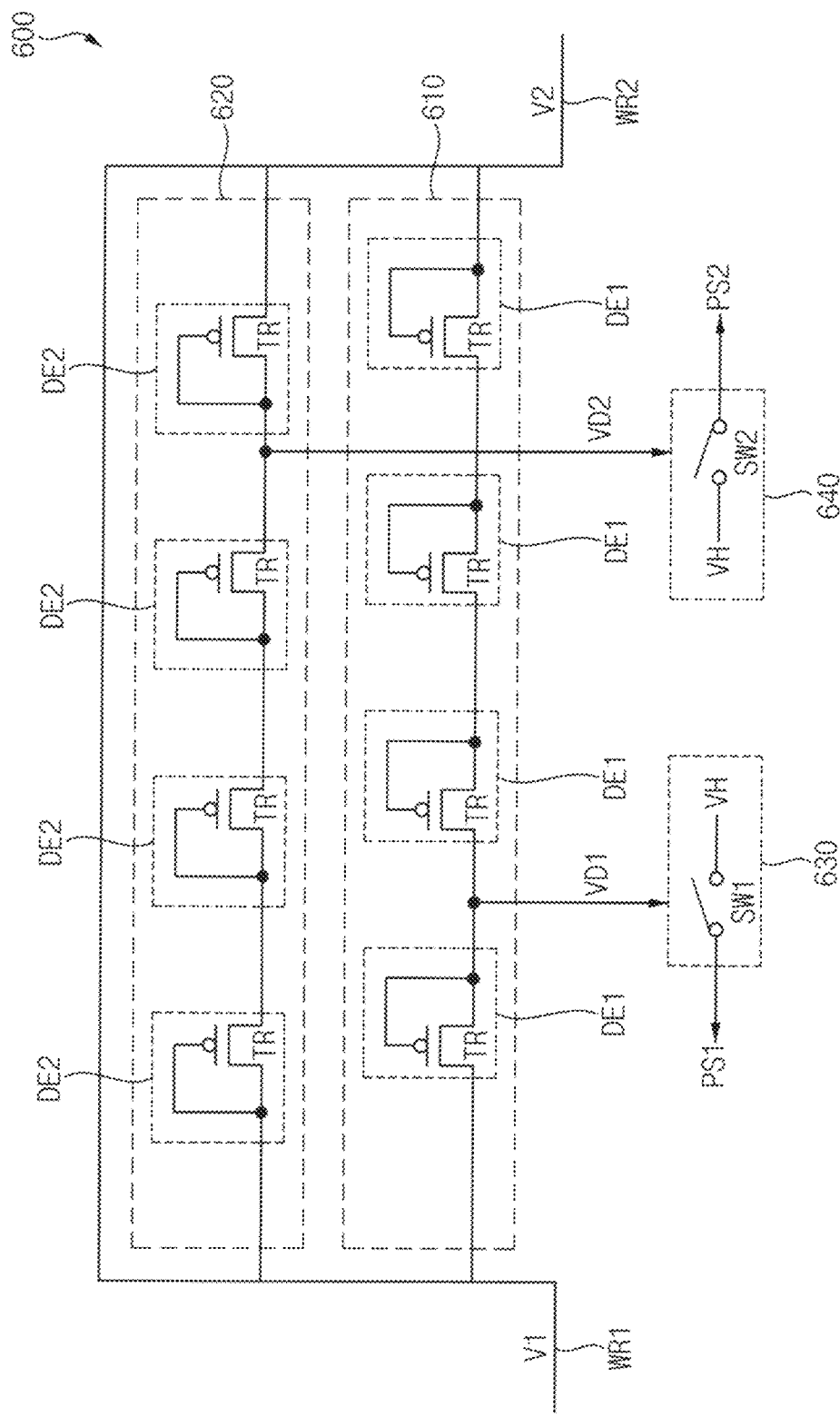
FIG. 5 is a circuit diagram illustrating an abnormal coupling detector included in the display device in FIG. 4.

FIG. 5 is a circuit diagram illustrating the abnormal coupling detector 600 included in the display device 10 in FIG. 4.

Referring to FIG. 5, the abnormal coupling detector 600 may generate the first protection signal PS1 and the second protection signal PS2 based on a difference between a first voltage V1 of the first wiring WR1 and a second voltage V2 of the second wiring WR2. An electrical resistance may be formed between the first wiring WR1 and the second wiring WR2, so that the first voltage V1 of the first wiring WR1 may be substantially equal to or different from the second voltage V2 of the second wiring WR2. The abnormal coupling detector 600 may include a first diode array 610, a second diode array 620, a first protection signal generator 630, and a second protection signal generator 640.

The first diode array 610 may include first diodes DE1. The first diodes DE1 may be connected in series in a forward direction from the second wiring WR2 to the first wiring WR1. In other words, the first diodes DE1 may be connected in series such that an anode of one first diode DE1 is connected to a cathode of another first diode DE1, and an anode of the foremost first diode DE1 (e.g., rightmost first diode DE1) may be connected to the second wiring WR2, and a cathode of the rearmost first diode DE1 (e.g., leftmost first diode DE1) may be connected to the first wiring WR1. Therefore, a current flows through the first diode array 610 only when the second voltage V2 of the second wiring WR2 is greater than the first voltage V1 of the first wiring WR1 in a predetermined amount or more.

Each of the first diodes DE1 may be a diode-connected transistor TR. As a first electrode of the transistor TR is connected to a gate electrode of the transistor TR, the transistor TR may function as a diode. In this case, the first electrode and a second electrode of the transistor TR may function as an anode and a cathode of the diode, respectively.

The second diode array 620 may include second diodes DE2. The second diodes DE2 may be connected in series in a forward direction from the first wiring WR1 to the second wiring WR2. In other words, the second diodes DE2 may be connected in series such that an anode of one second diode DE2 is connected to a cathode of another second diode DE2, an anode of the foremost second diode DE2 (e.g., leftmost second diode DE2) may be connected to the first wiring WR1, and a cathode of the rearmost second diode DE2 (e.g., rightmost second diode DE2) may be connected to the second wiring WR2. Therefore, a current flows through the second diode array 620 only when the first voltage V1 of the first wiring WR1 is greater than the second voltage V2 of the second wiring WR2 in a predetermined amount or more.

Each of the second diodes DE2 may be a diode-connected transistor TR.

FIG. 5 illustrates an embodiment in which the diode-connected transistor TR is a PMOS transistor, but the present disclosure is not limited thereto. In another embodiment, the diode-connected transistor TR may be an NMOS transistor.

The first protection signal generator 630 may generate the first protection signal PS1 in response to a voltage VD1 between the first diodes DE1. The first protection signal generator 630 may include a first switch SW1 turned on/off according to the voltage VD1 between the first diodes DE1. The first switch SW1 may be turned on when the voltage VD1 between the first diodes DE1 is within a preset voltage range, and may be turned off when the voltage VD1 between the first diodes DE1 is out of the preset voltage range. When the first switch SW1 is turned on, the first protection signal PS1 having a high voltage VH (e.g., about 3.3 V) may be generated.

The second protection signal generator 640 may generate the second protection signal PS2 in response to a voltage VD2 between the second diodes DE2. The second protection signal generator 640 may include a second switch SW2 turned on/off according to the voltage VD2 between the second diodes DE2. The second switch SW2 may be turned on when the voltage VD2 between the second diodes DE2 is within a preset voltage range, and may be turned off when the voltage VD2 between the second diodes DE2 is out of the preset voltage range. When the second switch SW2 is turned on, the second protection signal PS2 having a high voltage VH (e.g., about 3.3 V) may be generated.

Figure 6:
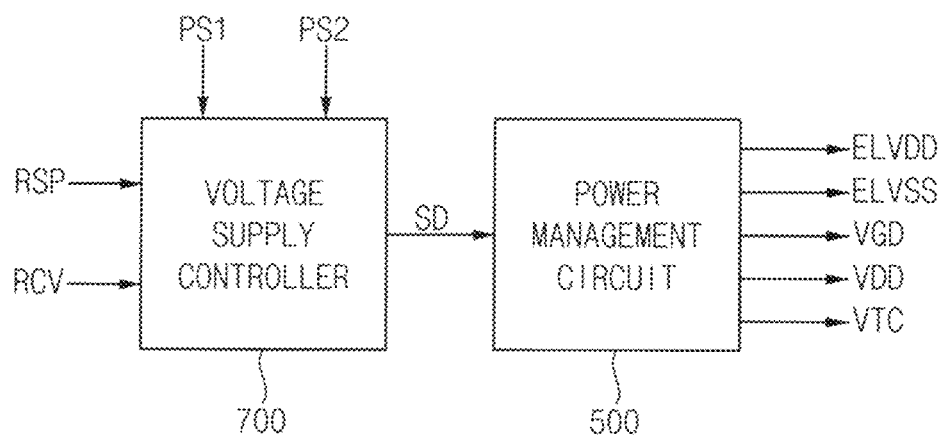
FIG. 6 is a block diagram illustrating a voltage supply controller and a power management circuit included in the display device in FIG. 1.

FIG. 6 is a block diagram illustrating the voltage supply controller 700 and the power management circuit 500 included in the display device 10 in FIG. 1.

Referring to FIGS. 1 and 6, the voltage supply controller 700 may count the first protection signal PS1 and the second protection signal PS2, and may provide the shutdown signal SD to the power management circuit 500.

The voltage supply controller 700 may count the first protection signal PS1 every frame to calculate a first count value, and may count the second protection signal PS2 every frame to calculate a second count value.

The voltage supply controller 700 may generate the shutdown signal SD when the first count value or the second count value is greater than a preset reference count value RCV during a preset reset period RSP. For example, when the preset reset period RSP is 120 frames and the reference count value RCV is 12, if at least one of the first count value and the second count value is greater than 12 during 120 frames, the voltage supply controller 700 may generate the shutdown signal SD.

The power management circuit 500 may stop providing the first driving voltage ELVDD, the gate driving voltage VGD, and the data driving voltage VDD in response to the shutdown signal SD. In an embodiment, when the second driving voltage ELVSS is about 0 V, the power management circuit 500 may not stop providing the second driving voltage ELVSS in response to the shutdown signal SD. In another embodiment, when the second driving voltage ELVSS is not about 0 V, the power management circuit 500 may stop providing the second driving voltage ELVSS in response to the shutdown signal SD.

When the supply of the first driving voltage ELVDD is stopped based on the shutdown signal SD, the pixels PX may not emit light. When the supply of the gate driving voltage VGD is stopped based on the shutdown signal SD, the operation of the gate driver 200 may be stopped, and the gate driver 200 may not generate the gate signals GS. When the supply of the data driving voltage VDD is stopped based on the shutdown signal SD, the operation of the data driver 300 may be stopped, and the data driver 300 may not generate the data voltages VDAT.

The power management circuit 500 may not stop providing the timing control voltage VTC in response to the shutdown signal SD. Accordingly, even when the shutdown signal SD is provided to the power management circuit 500, the timing controller 400 may be normally driven.

Figure 7:
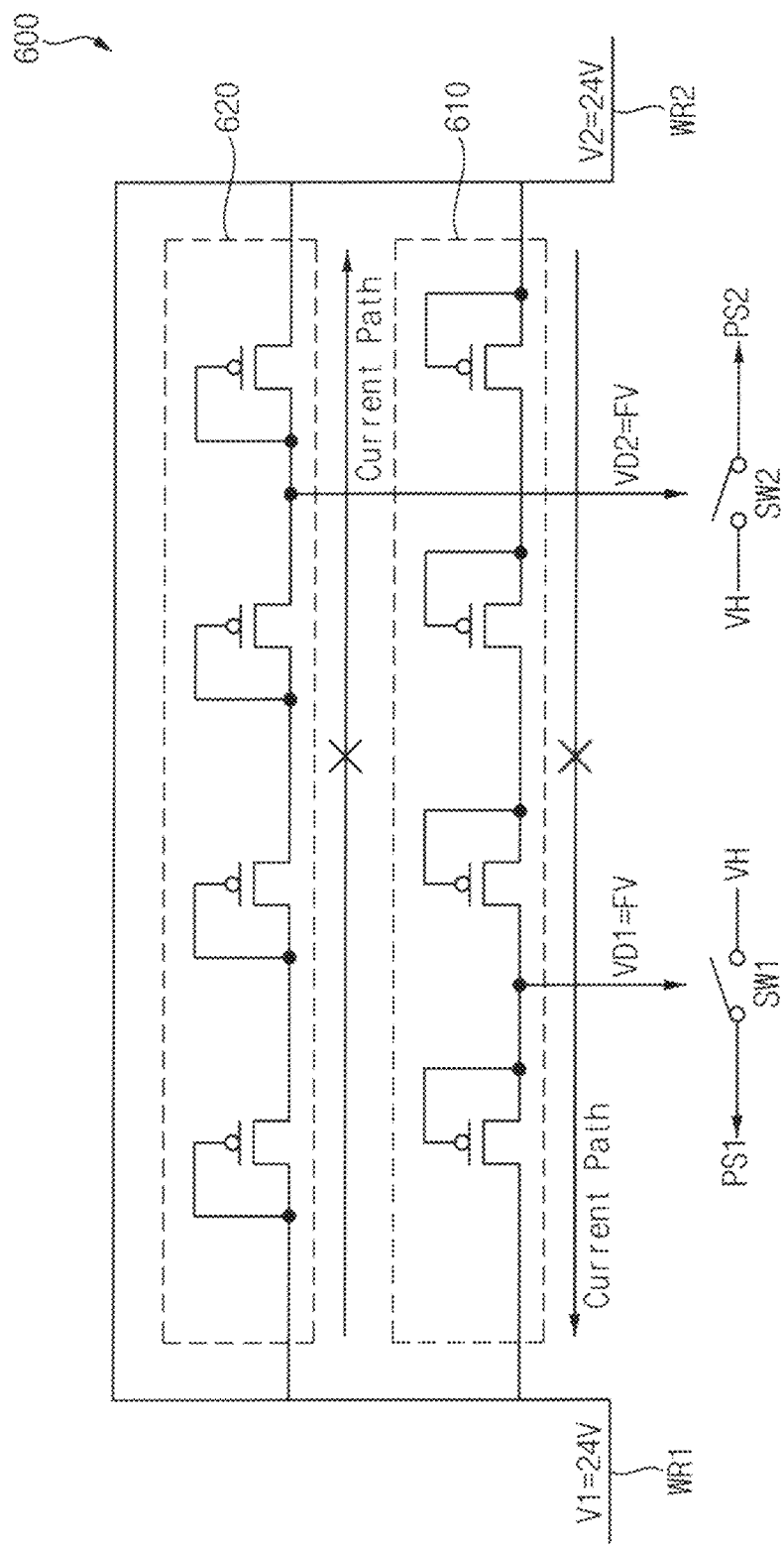
FIG. 7 is a diagram for describing an abnormal coupling detector when first and second cables are normally coupled.

FIG. 7 is a diagram for describing the abnormal coupling detector 600 when the first and second cables FFC1 and FFC2 are normally coupled.

Referring to FIGS. 4, 5, and 7, when the first cable FF1 is normally coupled to the control circuit board C-PBA and the first source circuit board S-PBA1, and the second cable FFC2 is normally coupled to the control circuit board C-PBA and the second source circuit board S-PBA2, a driving current flowing through the first wiring WR1 and a driving current flowing through the second wiring WR2 may be substantially equal to each other, and the first voltage V1 of the first wiring WR1 and the second voltage V2 of the second wiring WR2 may be substantially equal to each other. For example, the first voltage V1 and the second voltage V2 may each be about 24V.

When the difference between the first voltage V1 and the second voltage V2 is less than a preset difference, a current path through the first diode array 610 and a current path through the second diode array 620 may not be formed. That is, a current flows between the first wiring WR1 and the second wiring WR2 neither through the first diode array 610 nor through the second diode array 620. When the second voltage V2 is greater than or equal to the first voltage V1, the preset difference may be determined by the number of first diodes DE1 and threshold voltages of the first diodes DE1. For example, when the first diode array 610 includes four first diodes DE1 and the threshold voltage of each of the first diodes DE1 is about 0.6 V, the preset difference may be about 2.4 V (=0.6 V×4). When the first voltage V1 is greater than or equal to the second voltage V2, the preset difference may be determined by the number of second diodes DE2 and threshold voltages of the second diodes DE2. For example, when the second diode array 620 includes four second diodes DE2 and the threshold voltage of each of the second diodes DE2 is about 0.6 V, the preset difference may be about 2.4 V (=0.6 V×4).

When the current path through the first diode array 610 and the current path through the second diode array 620 are not formed, the voltage VD1 between the first diodes DE1 and the voltage VD2 between the second diodes DE2 may be floated. Accordingly, each of the voltage VD1 between the first diodes DE1 and the voltage VD2 between the second diodes DE2 may have a floating voltage FV. The first switch SW1 may be turned off when the voltage VD1 between the first diodes DE1 is floated, and the second switch SW2 may be turned off when the voltage VD2 between the second diodes DE2 is floated. Accordingly, the first protection signal PS1 and the second protection signal PS2 may not be generated.

Figure 8:
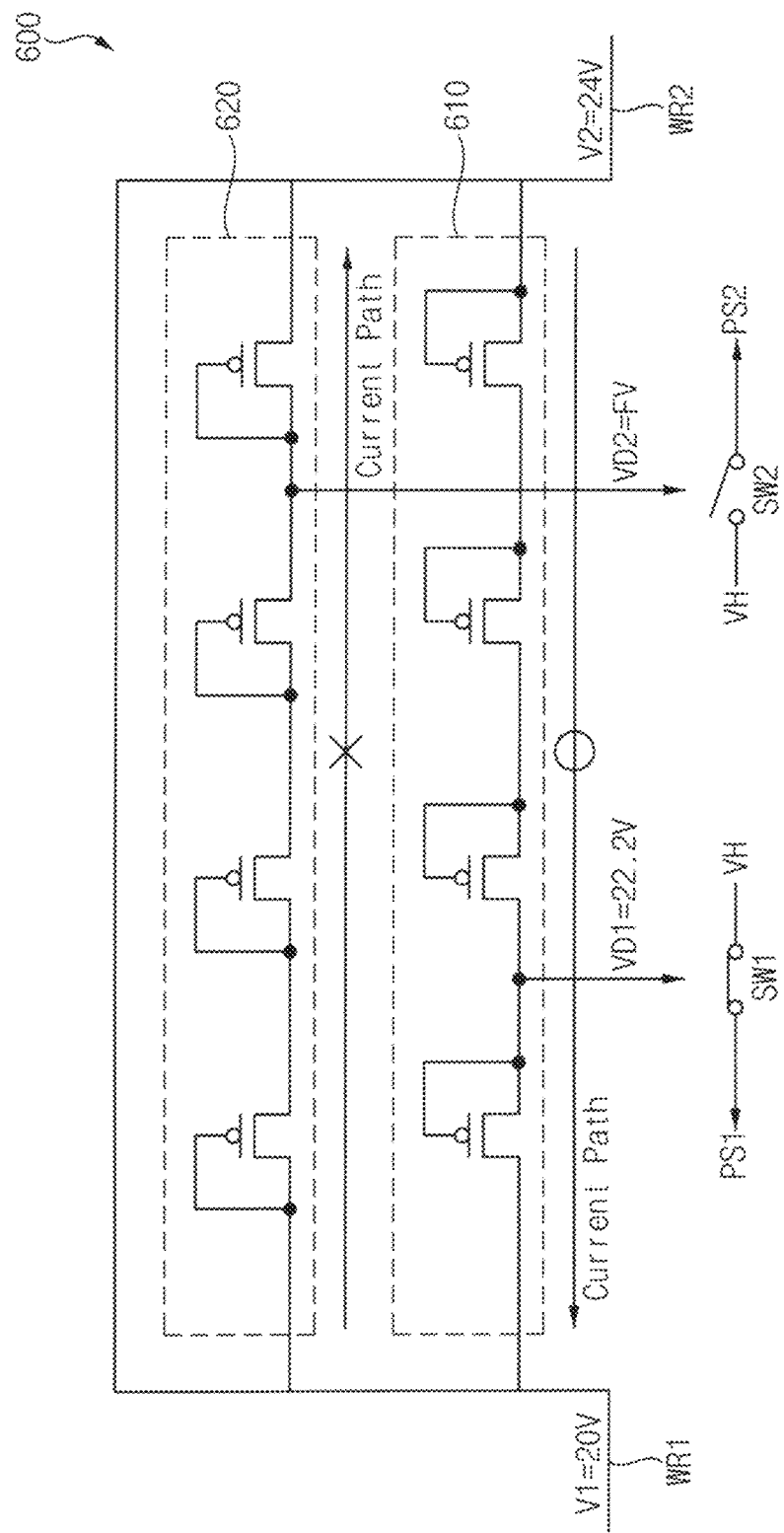
FIG. 8 is a diagram for describing an abnormal coupling detector when a first cable is abnormally coupled.

FIG. 8 is a diagram for describing the abnormal coupling detector 600 when the first cable FFC1 is abnormally coupled.

Referring to FIGS. 4, 5, and 8, when the first cable FFC1 is abnormally coupled to the control circuit board C-PBA and/or the first source circuit board S-PBA1, a contact resistance between the first cable FFC1 and the control circuit board C-PBA and/or a contact resistance between the first cable FFC1 and the first source circuit board S-PBA1 may increase. Accordingly, a driving current flowing through the first wiring WR1 may be less than a driving current flowing through the second wiring WR2, and the second voltage V2 of the second wiring WR2 may be greater than the first voltage V1 of the first wiring WR1. For example, the first voltage V1 may be about 20 V, and the second voltage V2 may be about 24 V.

When the second voltage V2 is greater than the first voltage V1, and the difference between the first voltage V1 and the second voltage V2 is greater than a preset difference, a current path from the second wiring WR2 to the first wiring WR1 through the first diode array 610 may be formed, and a current path through the second diode array 620 may not be formed. The preset difference may be determined by the number of first diodes DE1 and threshold voltages of the first diodes DE1. For example, when the first diode array 610 includes four first diodes DE1 and the threshold voltage of each of the first diodes DE1 is about 0.6 V, the preset difference may be about 2.4 V (=0.6 V×4).

When the current path through the first diode array 610 is formed, the voltage VD1 between the first diodes DE1 may have a value between the first voltage V1 and the second voltage V2. For example, when the voltage VD1 between the first diodes DE1 is a voltage VD1 between the foremost first diode DE1 and the next first diode DE1, the voltage VD1 between the first diodes DE1 may be about 22.2 V (=24 V−0.6 V×3). When the voltage VD1 between the first diodes DE1 has a value between the first voltage V1 and the second voltage V2, the first switch SW1 may be turned on. Accordingly, the first protection signal PS1 having the high voltage VH may be generated.

If the current path through the second diode array 620 is not formed, the voltage VD2 between the second diodes DE2 may be floated. When the voltage VD2 between the second diodes DE2 is floated, the second switch SW2 may be turned off. Accordingly, the second protection signal PS2 may not be generated.

Figure 9:
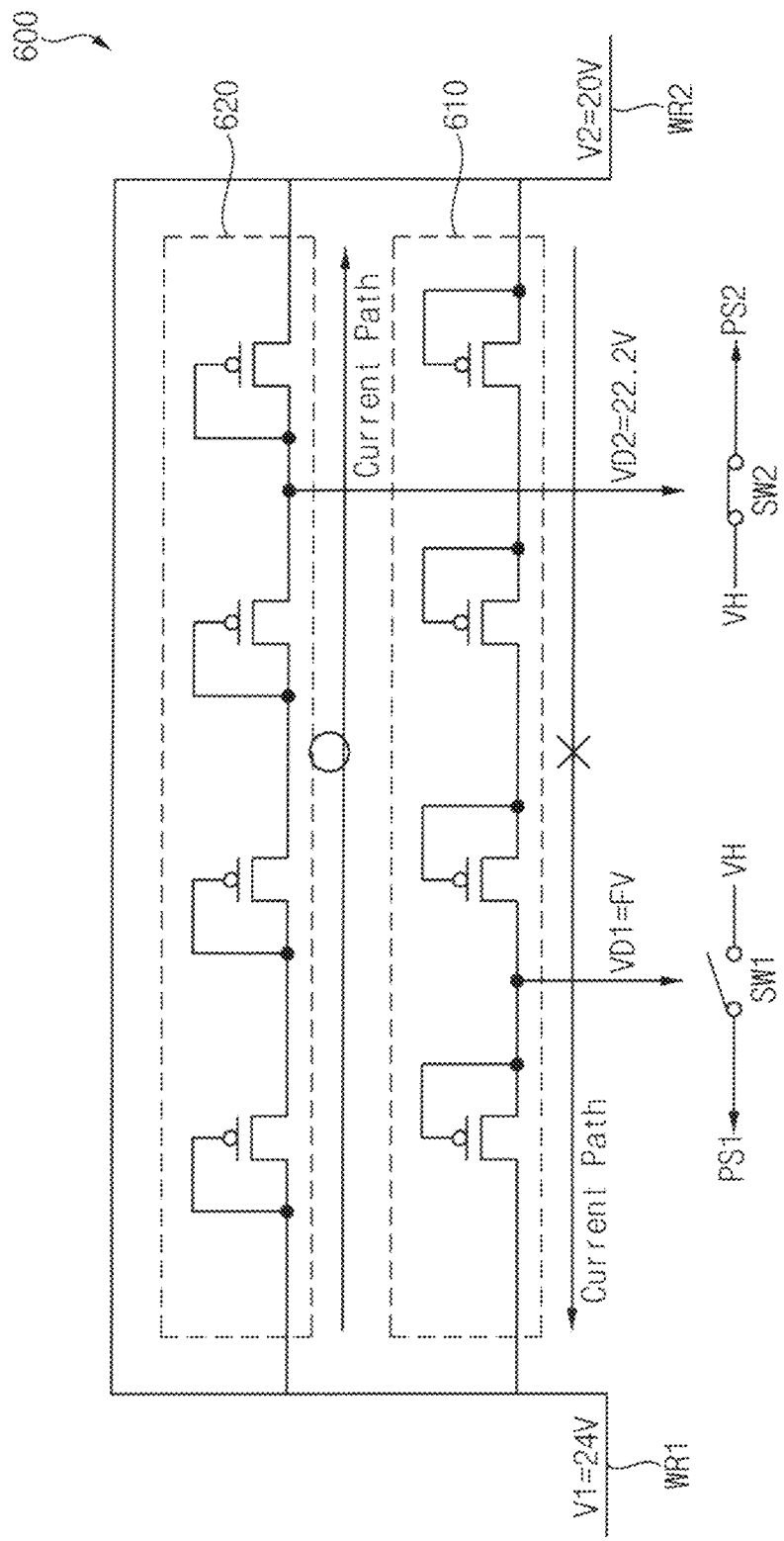
FIG. 9 is a diagram for describing an abnormal coupling detector when a second cable is abnormally coupled.

FIG. 9 is a diagram for describing the abnormal coupling detector 600 when the second cable FFC2 is abnormally coupled.

Referring to FIGS. 4, 5, and 9, when the second cable FFC2 is abnormally coupled to the control circuit board C-PBA and/or the second source circuit board S-PBA2, a contact resistance between the second cable FFC2 and the control circuit board C-PBA and/or a contact resistance between the second cable FFC2 and the second source circuit board S-PBA2 may increase. Accordingly, a driving current flowing through the second wiring WR2 may be less than a driving current flowing through the first wiring WR1, and the first voltage V1 of the first wiring WR1 may be greater than the second voltage V2 of the second wiring WR2. For example, the first voltage V1 may be about 24 V, and the second voltage V2 may be about 20 V.

When the first voltage V1 is greater than the second voltage V2, and the difference between the first voltage V1 and the second voltage V2 is greater than a preset difference, a current path from the first wiring WR1 to the second wiring WR2 through the second diode array 620 may be formed, and a current path through the first diode array 610 may not be formed. The preset difference may be determined by the number of second diodes DE2 and threshold voltages of the second diodes DE2. For example, when the second diode array 620 includes four second diodes DE2 and the threshold voltage of each of the second diodes DE2 is about 0.6 V, the preset difference may be about 2.4 V (=0.6 V×4).

When the current path through the second diode array 620 is formed, the voltage VD2 between the second diodes DE2 may have a value between the first voltage V1 and the second voltage V2. For example, when the voltage VD2 between the second diodes DE2 is a voltage VD2 between the foremost second diode DE2 and the next second diode DE2, the voltage VD2 between the second diodes DE2 may be about 22.2 V (=24 V−0.6 V×3). When the voltage VD2 between the second diodes DE2 has a value between the first voltage V1 and the second voltage V2, the second switch SW2 may be turned on. Accordingly, the second protection signal PS2 having the high voltage VH may be generated.

When the current path through the first diode array 610 is not formed, the voltage VD1 between the first diodes DE1 may be floated. When the voltage VD1 between the first diodes DE1 is floated, the first switch SW1 may be turned off. Accordingly, the first protection signal PS1 may not be generated.

Figure 10:
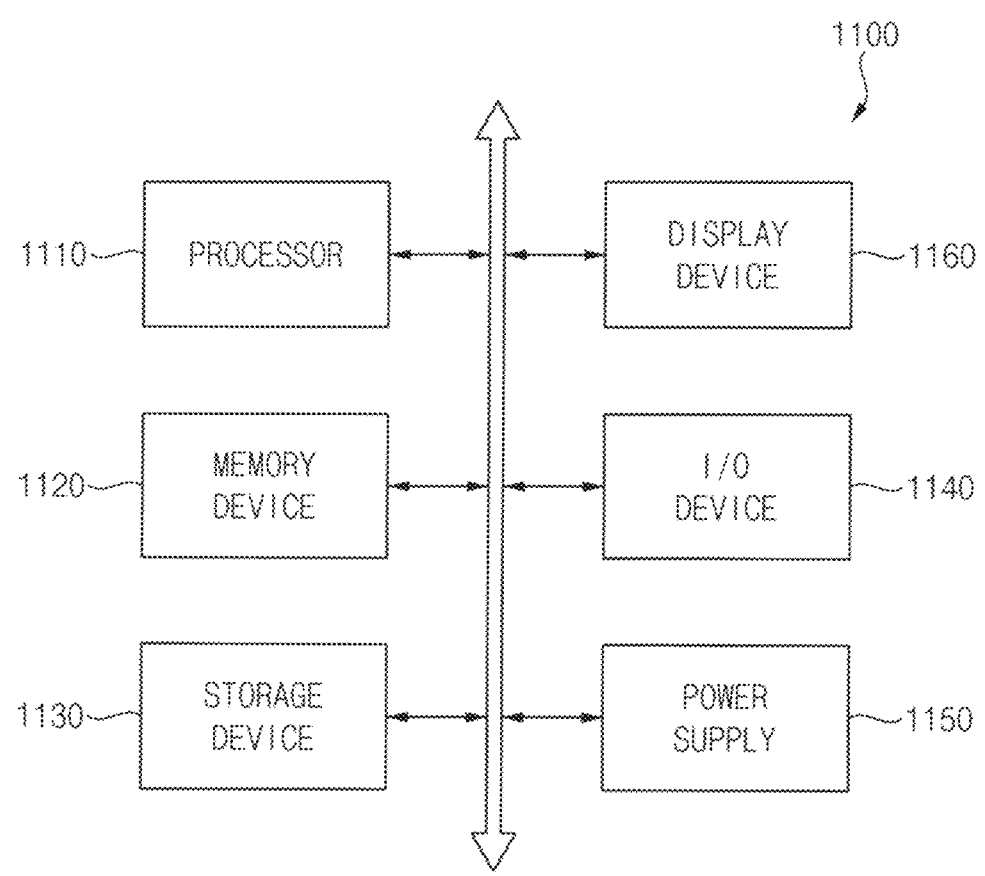
FIG. 10 is a block diagram illustrating an electronic apparatus including a display device according to an embodiment.

FIG. 10 is a block diagram illustrating an electronic apparatus 1100 including a display device 1160 according to an embodiment.

Referring to FIG. 10, the electronic apparatus 1100 may include a processor 1110, a memory device 1120, a storage device 1130, an input/output ("I/O") device 1140, a power supply 1150, and a display device 1160. The electronic apparatus 1100 may further include a plurality of ports for communicating with a video card, a sound card, a memory card, a universal serial bus ("USB") device, etc.

The processor 1110 may perform particular calculations or tasks. In an embodiment, the processor 1110 may be a microprocessor, a central processing unit ("CPU"), or the like. The processor 1110 may be coupled to other components via an address bus, a control bus, a data bus, or the like. In an embodiment, the processor 1110 may be coupled to an extended bus such as a peripheral component interconnection ("PCI") bus.

The memory device 1120 may store data for operations of the electronic apparatus 1100. In an embodiment, the memory device 1120 may include a non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or a volatile memory device such as a dynamic random access memory ("DRAM") device, a static random access memory ("SRAM") device, a mobile DRAM device, etc.

The storage device 1130 may include a solid state drive ("SSD") device, a hard disk drive ("HDD") device, a CD-ROM device, or the like. The I/O device 1140 may include an input device such as a keyboard, a keypad, a touchpad, a touch-screen, a mouse device, etc., and an output device such as a speaker, a printer, etc. The power supply 1150 may supply a power required for the operation of the electronic apparatus 1100. The display device 1160 may be coupled to other components via the buses or other communication links.

In the display device 1160, abnormal coupling of a first cable or a second cable may be detected based on a difference between a first voltage of a first wiring electrically connected to the first cable and a second voltage of a second wiring electrically connected to the second cable, and providing of a driving voltage may be stopped when the first cable or the second cable is abnormally coupled, so that a display panel may not be burnt due to the abnormal coupling of the first cable or the second cable.

The display device according to the embodiments may be applied to a display device included in a computer, a notebook, a mobile phone, a smart phone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device, comprising:
  a display panel including a first wiring and a second wiring;
  a control circuit board spaced apart from the display panel and including a power management circuit which provides a driving voltage to the first wiring and the second wiring;
  a first cable having a first end coupled to the control circuit board, the first cable electrically connecting the power management circuit and the first wiring;
  a second cable having a first end coupled to the control circuit board, the second cable electrically connecting the power management circuit and the second wiring;
  an abnormal coupling detector connected between the first wiring and the second wiring, and which generates a first protection signal and a second protection signal based on a difference between a first voltage of the first wiring and a second voltage of the second wiring; and
  a voltage supply controller, which counts the first protection signal and the second protection signal, and provides a shutdown signal to the power management circuit such that the power management circuit stops providing the driving voltage.

2. The display device of claim 1, wherein the abnormal coupling detector includes:
  a first diode array including first diodes connected in series in a forward direction from the second wiring to the first wiring; and
  a second diode array including second diodes connected in series in a forward direction from the first wiring to the second wiring.

3. The display device of claim 2, wherein the first diodes and the second diodes are diode-connected transistors.

4. The display device of claim 2, wherein the abnormal coupling detector further includes:
  a first protection signal generator, which generates the first protection signal in response to a voltage between the first diodes; and
  a second protection signal generator, which generates the second protection signal in response to a voltage between the second diodes.

5. The display device of claim 4, wherein the first protection signal generator includes a first switch, which is on/off according to the voltage between the first diodes, and
  wherein the second protection signal generator includes a second switch, which is on/off according to the voltage between the second diodes.

6. The display device of claim 2, further comprising:
  a first source circuit board coupled to a second end of the first cable;
  a second source circuit board coupled to a second end of the second cable; and
  flexible circuit boards each connected between the display panel and the first source circuit board or between the display panel and the second source circuit board.

7. The display device of claim 6, wherein, when the first cable is normally coupled to the control circuit board and the first source circuit board, and the second cable is normally coupled to the control circuit board and the second source circuit board, a current path is not formed between the first wiring and the second wiring through the first diode array and the second diode array.

8. The display device of claim 6, wherein, when the first cable is abnormally coupled to the control circuit board or the first source circuit board, a current path is formed from the second wiring to the first wiring through the first diode array, and
  wherein, when the second cable is abnormally coupled to the control circuit board or the second source circuit board, a current path is formed from the first wiring to the second wiring through the second diode array.

9. The display device of claim 1, wherein the voltage supply controller counts the first protection signal and the second protection signal every frame to calculate a first count value and a second count value, respectively.

10. The display device of claim 9, wherein the voltage supply controller generates the shutdown signal when the first count value or the second count value is greater than a preset reference count value during a preset reset period.

11. A display device, comprising:
  a display panel including pixels, and a first wiring and a second wiring which provide a driving voltage to the pixels;
  a gate driver, which provides gate signals to the pixels;
  a data driver, which provides data voltages to the pixels;
  a power management circuit, which provides the driving voltage to the first wiring and the second wiring, provides a gate driving voltage to the gate driver, and provides a data driving voltage to the data driver;
  an abnormal coupling detector connected between the first wiring and the second wiring, and which generates a first protection signal and a second protection signal based on a difference between a first voltage of the first wiring and a second voltage of the second wiring; and
  a voltage supply controller, which counts the first protection signal and the second protection signal, and provides a shutdown signal to the power management circuit such that the power management circuit stops providing the driving voltage, the gate driving voltage, and the data driving voltage.

12. The display device of claim 11, wherein the abnormal coupling detector includes:
  a first diode array including first diodes connected in series in a forward direction from the second wiring to the first wiring; and
  a second diode array including second diodes connected in series in a forward direction from the first wiring to the second wiring.

13. The display device of claim 12, wherein the first diodes and the second diodes are diode-connected transistors.

14. The display device of claim 12, wherein the abnormal coupling detector further includes:
a first protection signal generator, which generates the first protection signal in response to a voltage between the first diodes; and
a second protection signal generator, which generates the second protection signal in response to a voltage between the second diodes.

15. The display device of claim 14, wherein the first protection signal generator includes a first switch, which is on/off according to the voltage between the first diodes, and
wherein the second protection signal generator includes a second switch, which is on/off according to the voltage between the second diodes.

16. The display device of claim 12, further comprising:
a control circuit board spaced apart from the display panel and including the power management circuit;
a first cable having a first end coupled to the control circuit board, the first cable electrically connecting the power management circuit and the first wiring;
a second cable having a first end coupled to the control circuit board, the second cable electrically connecting the power management circuit and the second wiring;
a first source circuit board coupled to a second end of the first cable;
a second source circuit board coupled to a second end of the second cable; and
flexible circuit boards each connected between the display panel and the first source circuit board or between the display panel and the second source circuit board.

17. The display device of claim 16, wherein, when the first cable is normally coupled to the control circuit board and the first source circuit board, and the second cable is normally coupled to the control circuit board and the second source circuit board, a current path is not formed between the first wiring and the second wiring through the first diode array and the second diode array.

18. The display device of claim 16, wherein, when the first cable is abnormally coupled to the control circuit board or the first source circuit board, a current path is formed from the second wiring to the first wiring through the first diode array, and
wherein, when the second cable is abnormally coupled to the control circuit board or the second source circuit board, a current path is formed from the first wiring to the second wiring through the second diode array.

19. The display device of claim 11, wherein the voltage supply controller counts the first protection signal and the second protection signal every frame to calculate a first count value and a second count value, respectively.

20. The display device of claim 19, wherein the voltage supply controller generates the shutdown signal when the first count value or the second count value is greater than a preset reference count value during a preset reset period.

* * * * *